United States Patent [19]
Grimm

[11] Patent Number: 5,261,964
[45] Date of Patent: Nov. 16, 1993

[54] EVAPORATOR BOAT FOR AN APPARATUS FOR COATING SUBSTRATES

[75] Inventor: Helmut Grimm, Darmstadt, Fed. Rep. of Germany

[73] Assignee: Leybold Aktiengesellschaft, Hanau, Fed. Rep. of Germany

[21] Appl. No.: 862,223

[22] Filed: Apr. 2, 1992

[30] Foreign Application Priority Data

Dec. 3, 1991 [DE] Fed. Rep. of Germany ....... 4139792

[51] Int. Cl.⁵ .................. C23C 14/00; C23C 14/26
[52] U.S. Cl. ............................ 118/726; 373/118; 392/389
[58] Field of Search ............... 118/726; 373/118; 392/388, 389

[56] References Cited

U.S. PATENT DOCUMENTS 3,210,525  10/1965  Liben ...................... 118/726 X
3,231,846  1/1966   Radke ..................... 392/389 X
3,598,958  8/1971   Davey et al. ............... 392/389
3,637,980  1/1971   Fox et al. ................. 392/389
3,930,463  1/1976   Bickerdike et al. ........... 118/726

FOREIGN PATENT DOCUMENTS 869825   3/1953   Fed. Rep. of Germany ...... 392/389
970246   8/1958   Fed. Rep. of Germany .
4027034  9/1991   Fed. Rep. of Germany .
4016225  11/1991  Fed. Rep. of Germany .
387050   10/1973  U.S.S.R. .

OTHER PUBLICATIONS

Webster's II New Riverside University Dictionary, p. 1008.

Primary Examiner—Brian E. Hearn
Assistant Examiner—Jonathan D. Baskin
Attorney, Agent, or Firm—Felfe & Lynch

[57] ABSTRACT

An evaporator boat for an apparatus for coating substrates in a vacuum coating chamber consists of a shallow, trough-shaped piece of an electrically conductive material, the boat being heated by direct passage of current through it. The evaporator boat has an elongate hexagonal plan, the configuration of the recess within the boat for containing the material to be evaporated corresponding approximately to that of the boat. Lengthwise opposed ends of the evaporator boat are provided each with an approximately rectangular, perpendicular flat area. The flat areas together form two directly opposed parallel clamping surfaces of the evaporator boat so that when the evaporator boat is heated, two active evaporating zones form on both sides of the point of contact between the delivered wire and the evaporator boat.

10 Claims, 1 Drawing Sheet

EVAPORATOR BOAT FOR AN APPARATUS FOR COATING SUBSTRATES

BACKGROUND OF THE INVENTION

The invention relates to an evaporator boat for an apparatus for coating substrates in a vacuum coating chamber, consisting of a shallow, trough-like piece of an electrically conductive material, the boat being heated by direct passage of electrical current through it.

Evaporator boats are known—especially series evaporators—which are rectangular in plan and are provided at their two vertical short sides with clamping surfaces, or flats, by which they are held on the boat holder.

DE-A 40 27 034 discloses apparatus for the continuous coating of substrates in band form, in a vacuum coating chamber having a plurality of evaporator boats of approximately equal size and configuration forming a bank of evaporators arranged at approximately equal distances apart, parallel to one another and lengthwise of the direction of band movement. The boats are all formed from an electrically conductive ceramic and heated by direct passage of electric current through them. The apparatus has a device for the continuous delivery of wire to the evaporator boats for evaporation, and the individual evaporator boats are arranged each offset from the other, all the evaporator boats together covering a narrow coating zone extending transversely from the direction of band movement.

The offset arrangement is said to solve the problem of reducing the interaction of the individual sources and thereby to improve the coating uniformity. The individual evaporator boats themselves have a rectangular cross section, and the recesses for containing the molten material all have a rectangular plan.

DE-A 970 246 discloses apparatus for the continuous evaporation of endless material wherein a plurality of directly heated evaporators lie one behind the other in a row. Here, the attempt has been made to overcome a disadvantage of the known type of evaporator of rectangular bottom surface in the recess. The disadvantage is due to the fact that the evaporating material, being an excellent conductor for the heat inducing electrical current, partially short-circuits the evaporator, so that only those portions of the evaporator that are present between the individual recesses serve for heat generation. This condition results in a non-uniform temperature distribution in the boat and non-uniform coating of the finished product. According to this earlier disclosure, this disadvantage is said to be eliminated by the fact that the evaporator has thinner cross section between the individual recesses so that the electrical resistance of the evaporator is approximately constant and independent of the amount of the evaporating material in the chambers.

DE-A 40 16 225 discloses a serial evaporator for vacuum coating apparatus, especially band coating apparatus, is described, consisting of a plurality of evaporators of individually controllable power, heated by passing electric current through them, and lying against pin-like electrical feeders. These pin-like feeders are held by an electrically conductive support extending over the entire length of the serial evaporator, the feeders of the one polarity being connected electrically to the support and the feeders of the other polarity being brought in an insulated manner through the support and connected to insulated conductor wires. The evaporators rest on bearing means configured preferably as cylinder sections at the upper ends or terminals of the feeders. For this purpose the bearing means are made from a current-conducting material, such as ceramic.

This older serial evaporator solves the problem of holding the evaporators in pairs between the electrical feeders and of good electrical contact during the vapor depositing process. But even with this pair-wise arrangement of evaporators, the problem of optimal temperature distribution within the boat contents to help obtain a uniform coating is not yet fully solved.

SUMMARY OF THE INVENTION

It is therefore an objective of the invention to provide a uniform temperature distribution of the material contained within the evaporator boat so as to permit an optimal coating during the vacuum deposition process.

The evaporator boat has an elongate hexagonal plan, the configuration of the recess being substantially the same as that of the boat, and two opposite ends of the boat provided each with an approximately rectangular, perpendicular flat, the two together forming clamping surfaces, parallel to one another, where the crucible is clamped.

The plan configuration of the evaporator boat having a total of six corners, is given a width-to-length ratio of about 1:4, the ratio of the greatest width to the width at a clamping point being approximately 1.3:1.

In one preferred embodiment, the configuration of the evaporator boat, cut off at two diametrically opposite ends, is an octagon in which the four corners in each diametrically opposed pair are of approximately the same angle, and in which the ratio of the greatest length of the recess to its greatest width is made smaller than the ratio of the greatest length of the whole boat to its greatest width.

DETAILED DESCRIPTION OF THE PREFERRED EMBODIMENT

Referring to the prior art, because of the cooling action of the jaws gripping the boat, a temperature gradient forms in the boat, with the hottest zone A in the middle of the boat 1, and the cooler surface near the clamping regions at the extremities of the boat. In the hotter zone, zone A (FIG. 1) of about 2 to 3 centimeters' length (with a total cavity length of 9 cm), experience has shown that twice as much aluminum per unit area is evaporated as over the rest of the cavity surface.

In order to obtain an evaporation free of spattering and therefore a coating free of pinholes, a predetermined (maximum) temperature must not be exceeded anywhere on the surface of the molten metal in the boat. The hottest temperature is defined by the temperature of the hot zone A. A rate of evaporation averaged over the total cavity area is thus obtained. According to the invention a more uniform temperature gradient is to be reached across the surface of the molten metal so that a larger area can be raised to this (maximum) temperature, resulting in a greater average rate of spatter-free evaporation.

Figure 1:
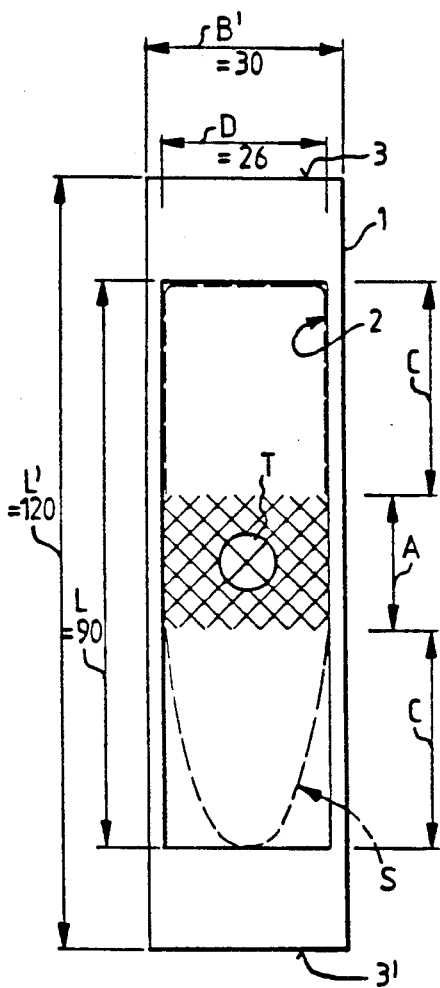
FIG. 1 shows a prior art boat in plan
Figure 2:
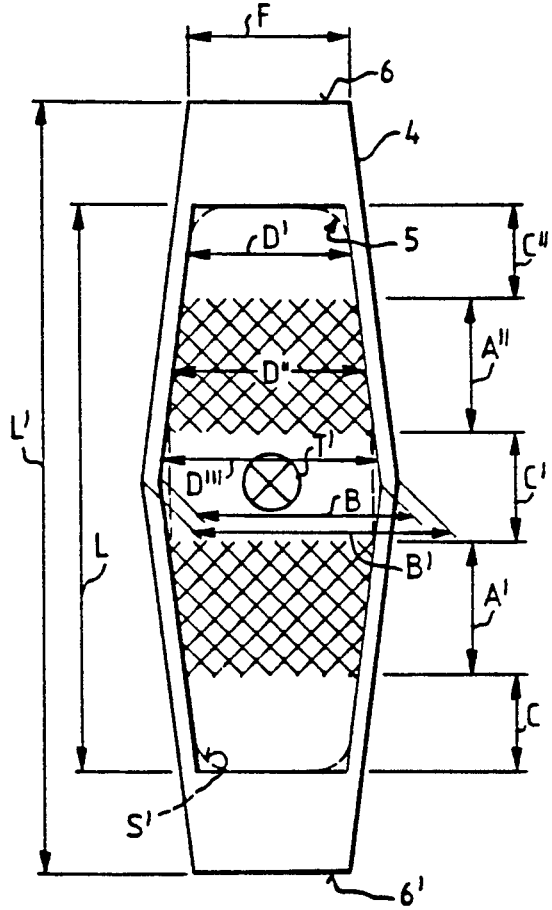
FIG. 2A is an end view of the boat of the present invention.
Figure 1A:
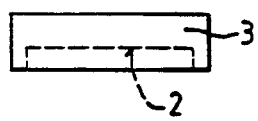
FIG. 1A is an end view of the prior art boat FIG. 2 a boat in accordance with the present invention in plan
Figure 2A:
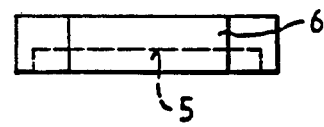

With the boat clamped at the front end as provided, it is now possible to achieve this aim without great difficulty by a different configuration of the shape of the ceramic boat (FIG. 2). In FIGS. 1 and 2, the dimensions A, A', A" and C, C', C" represent the length of zones in the recess, while the dimensions D, D', D", D''' represent the width at the midpoint in each of these zones.

If one assumes that twice as much aluminum is evaporated per unit time over the hot zone A and over zones A' and A" as over the rest of the area, the following equation results:

$q_{norm}$ = Evaporaton rate in the cooler marginal zones $q_{hot}$ = Evaporation rate in the hot zone

[g·(min × cm²)]

$q_{hot}$ = 2 × $q_{norm}$ then the average evaporation $q_{std.}$ [g:min] in the case of a standard evaporator (FIG. 1)

$$q_{standard} = [2 \times C \times q_{norm} + A \times q_{hot}] \times D$$
$$= [2 \times 3.5 \, q_{norm} + 2 \times q_{hot}] \times 2.6$$
$$= [7 \times q_{norm} + 2 \, q_{hot}] \times 2.6$$
$$= 28.6 \times q_{norm}$$

with $$L_{total} = 2 \times C + A = 7.0 \text{ cm} + 2.0 \text{ cm} = 9.0 \text{ cm},$$

and for a hexagonal evaporator (FIG. 2)

$$q_{hot} = [2 \times (C' \times D') \times q_{norm} + (C \times D''') \times q_{norm} +$$
$$[(A' \times D'') \times q_{hot} + (A'' \times D'') \times q_{hot}]$$
$$= [2 \times 1.5 \times 2.5 \times q_{norm} + 2.0 \times 3.4 \times q_{norm} +$$
$$[(2.0 \times 3.4) \times q_{hot} + (2.0 \times 3.4) \times q_{hot}]$$
$$= [7.5 \times q_{norm} + 6.8 \times q_{norm}] + [13.6 \times q_{hot}]$$
$$= 14.3 \, q_{norm} + 27.2 \times q_{norm} = 41.5 \times q_{norm}$$

with $$L_{total} = 2 \times C' \, A' + A'' + C = 2 \times 1.5 \text{ cm} + 2.0 \text{ cm} +$$
$$2.0 \text{ cm} + 2.0 \text{ cm} = 9.0 \text{ cm}.$$

This would correspond to an increase of the average evaporation rate by about 45%. If it is assumed that in the two hot zones A' and A" in the case of the embodiment according to FIG. 2, not twice as much, but only 1.5 times as much is evaporated, there still remains an increase in the average evaporating rate of about 21%. Accordingly, the following advantages are the result:

1 st Advantage: Greater average evaporating rate from 28.6 $q_{norm}$ to 41.5 $q_{norm}$.

2 nd Advantage: Due to the smaller end face area 6 and 6', there is less heat removal through these surfaces.

3rd Advantage: Small cross section per unit area at the end faces 6 and 6' = great resistance per unit area = great heat output.

In the center, greater cross section = lower resistance per unit area = low heat output.

The result: Compensation of the remaining temperature profile across the surface of the molten metal in the boat and more uniform wetting over the entire surface of the cavity, which results in homogeneity of the coating and longer evaporator life.

While a standard boat (FIG. 1) upon heating up glows first brightly in the center of the boat and upon cooling becomes cold in the center last, in the elongated hexagonal boat (FIG. 2) two of these zones, A' and A", occur which are away from the center where the point of contact T' of the aluminum wire is located.

| Prior art. FIG. 1 | Present invention, FIG. 2 |
|---|---|
| Cavity (recess) area = | |
| $A^{Std}$ = 2.6 cm × 9.0 cm = 23.4 cm² | $A^{Hex}$ = 2.4 + 3.5:2 × 9.0 cm = 26.6 cm² |
| Amount wetted: 80% | Wetted: 90% |
| Effective evaporating area: | Effective evaporating area: |
| $A^{Std}$ 18.7 cm² | $A^{Hex}$ 23.9 cm² (i.e., about 27.6% greater) |
| Cooling area: | |
| $A^{Std}$ = 3.0 cm × 1.0 cm = 3 cm² | Cooling area: |
| | $A^{Hex}$ = 2.5 cm × 1.0 cm = 2.5 cm² (i.e., about 16.7% less) |

I claim:

1. Evaporator boat for evaporating material in an apparatus for coating a substrate in a vacuum coating chamber, said evaporator boat being made of an electrically conductive material which is heated by passing a current therethrough, said boat, seen in plan, having an elongated hexagonal shape with six corners and a pair of directly opposed parallel end surfaces for clamping the boat and passing said current therethrough, each end surface extending between a pair of adjacent corners, said boar having a length L' between said end surfaces and a maximum width B' between an opposed pair of corners midway between said end surfaces, said length L' being greater than said width B', said boat further having a recess of elongated hexagonal shape in said boat for containing the material to be evaporated.

2. Evaporator boat as in claim 1 wherein said boat has six corners and a length L' between said end surfaces and a maximum width B' midway between said end surfaces, said end surfaces having a width F, the ratio of L' to B' being 4 to 1, and the ratio of B' to F being 1.3 to 1.

3. Evaporator boat as in claim 1 wherein said boat has six corners and the corners in each pair of diametrically opposed corners are equiangular, said boat having a length L' between said end surfaces and a maximum width B' midway between said end surfaces, said recess having a length L and a maximum width B, the ratio of L' to B' being greater than the ratio of L to B.

4. Evaporator boat as in claim 1 wherein the width of said recess between the end surfaces and the middle of the boat becomes progressively wider toward the middle of the boat.

5. Evaporator boat for evaporating material in an apparatus for coating a substrate in a vacuum coating chamber, said evaporator boat being made of an electrically conductive material which is heated by passing a current therethrough, said boat seen in plan, having an elongate shape and a pair of directly opposed parallel end surfaces of width F, said end surfaces being used for clamping the boat and passing said current therethrough, said boat having a length L' between said end surfaces and a maximum width B' midway between said end surfaces, the length L' being greater than the width B', the width B' being greater than the width F by a ratio of 1.3 to 1, said boat further comprising a recess in said boat for containing the material to be evaporated, said recess having a length L and width B midway in its length.

6. Evaporator boat as in claim 5 wherein the ratio of L' to B' is 4 to 1.

7. Evaporator boat as in claim 5 wherein said boat is of elongate hexagonal shape having six corners.

8. Evaporator boat as in claim 7 wherein the corners in each diametrically opposed pair are equiangular.

9. Evaporator boat as in claim 5 wherein said boat has parallel lateral surfaces midway between said end surfaces, said boat being of elongate octagonal shape having eight corners.

10. Evaporator boat as in claim 5 wherein said recess has a like elongate shape as said boat.

* * * * *